United States Patent
Trivedi et al.

(10) Patent No.: US 6,640,331 B2
(45) Date of Patent: Oct. 28, 2003

(54) DECOUPLING CAPACITOR ASSIGNMENT TECHNIQUE WITH RESPECT TO LEAKAGE POWER

(75) Inventors: Pradeep Trivedi, Sunnyvale, CA (US); Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 28 days.

(21) Appl. No.: 09/997,843

(22) Filed: Nov. 29, 2001

(65) Prior Publication Data

US 2003/0106033 A1 Jun. 5, 2003

(51) Int. Cl.⁷ .............................................. G06F 17/50
(52) U.S. Cl. ................... 716/10; 716/12; 716/5
(58) Field of Search ................. 716/10, 12, 5

(56) References Cited

U.S. PATENT DOCUMENTS

| | | | | |
|---|---|---|---|---|
| 3,813,650 A | * | 5/1974 | Hunter | 438/6 |
| 4,827,428 A | * | 5/1989 | Dunlop et al. | 716/6 |
| 5,847,969 A | * | 12/1998 | Miller et al. | 716/17 |
| 5,938,755 A | * | 8/1999 | Yastrow | 703/15 |
| 5,963,728 A | * | 10/1999 | Hathaway et al. | 716/3 |
| 5,978,880 A | * | 11/1999 | Bruce et al. | 710/316 |
| 5,999,714 A | * | 12/1999 | Conn et al. | 716/2 |
| 6,086,628 A | * | 7/2000 | Dave et al. | 716/7 |
| 6,163,049 A | * | 12/2000 | Bui | 257/321 |
| 6,484,302 B1 | * | 11/2002 | Freymuth | 716/10 |
| 2001/0047507 A1 | * | 11/2001 | Pileggi et al. | 716/8 |
| 2002/0112220 A1 | * | 8/2002 | Miller | 716/10 |

FOREIGN PATENT DOCUMENTS

| | | | | |
|---|---|---|---|---|
| JP | 07098727 A | * | 4/1995 | G06F/17/50 |
| JP | 08272836 A | * | 10/1996 | G06F/17/50 |
| JP | 2000020565 A | * | 1/2000 | G06F/17/50 |

OTHER PUBLICATIONS

Chang et al., "Design techniques for a low–power low–cost CMOS A/D converter", IEEE Journal of Solid–State Circuits, vol. 33, Aug. 1998, pp. 1244–1248.*

NB9306505, "LSI Low Power Oriented Layout Method with Net Switching", IBM Technical Disclosure Bulletin, vol. 36, No. 6B, Jun. 1993, pp. 505–508 (4 pages).*

* cited by examiner

Primary Examiner—Matthew Smith
Assistant Examiner—Phallaka Kik
(74) Attorney, Agent, or Firm—Rosenthal & Osha L.L.P.

(57) ABSTRACT

A decoupling capacitor assignment technique that increases decoupling capacitance without violating a leakage power constraint of an integrated circuit is provided. The decoupling capacitor assignment technique selectively replaces decoupling capacitors associated with high driver decoupling capacitance need to available decoupling capacitance ratios with thin-oxide decoupling capacitors such that decoupling capacitance is increased and the leakage power constraint is met.

19 Claims, 5 Drawing Sheets

DECOUPLING CAPACITOR ASSIGNMENT TECHNIQUE WITH RESPECT TO LEAKAGE POWER

BACKGROUND OF INVENTION

Figure 1:
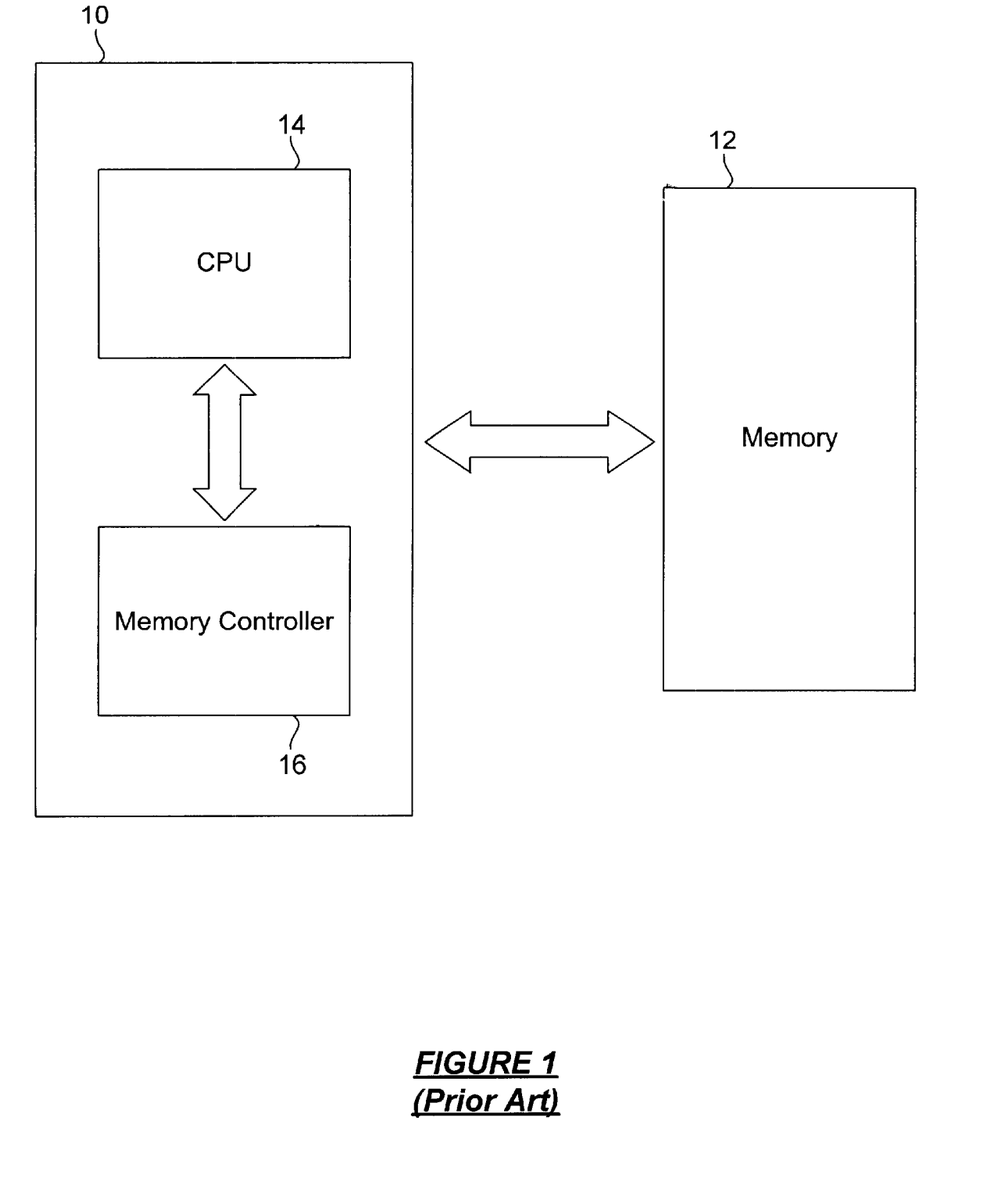
FIG. 1 shows a typical computer system.

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other components, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supply to a particular computer system element varies, which, in turn, effects the integrity of the element's output. Typically, this power variation results from the distance between a power supply for the element and the element itself. This distance may lead to the element not receiving power (via current) at the exact time it is required.

Figure 2:
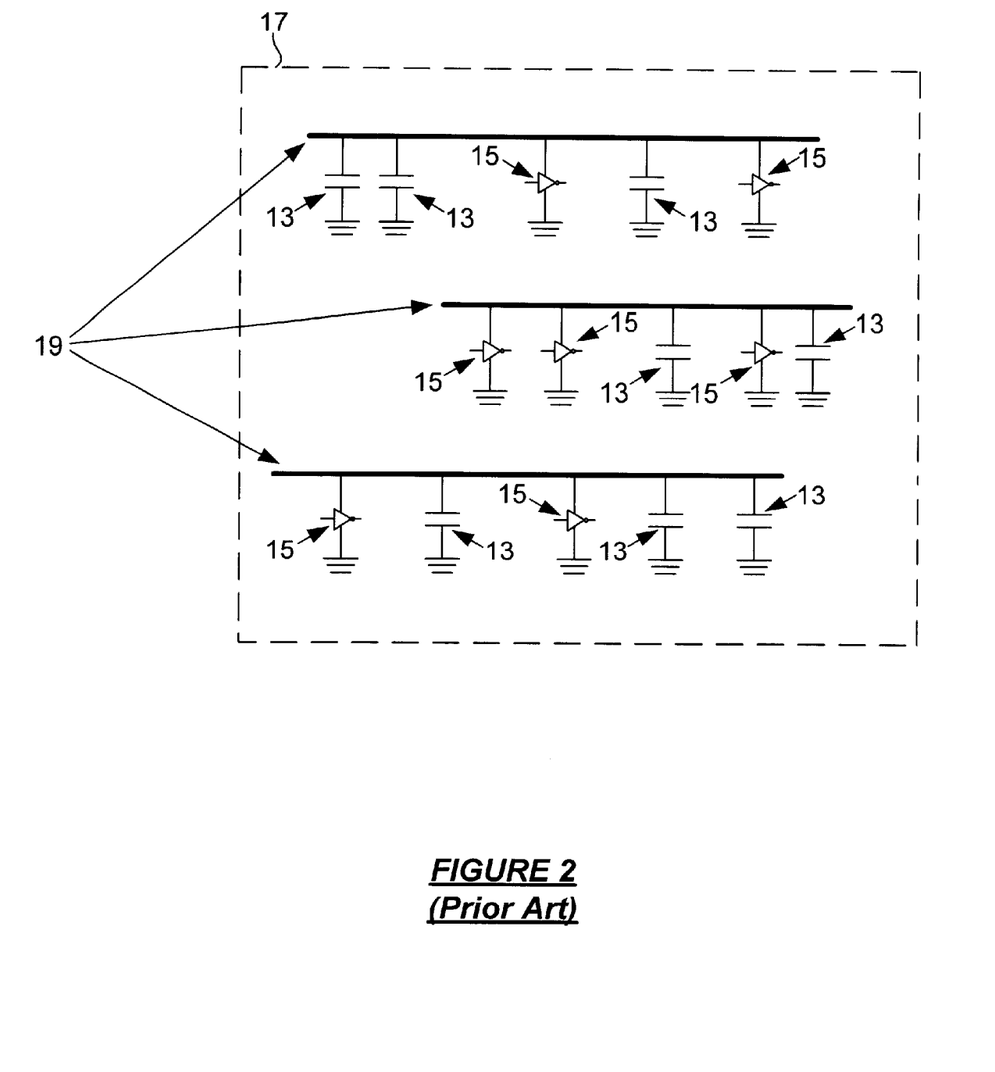
FIG. 2 shows a typical arrangement of decoupling capacitors and circuit elements.

As shown in FIG. 2, one approach used by designers to combat this performance-inhibiting behavior is introducing decoupling capacitance (also referred to as "decap") to a particular circuit by positioning one or more decoupling capacitors (13) close to elements (15) in an integrated circuit (17). These decoupling capacitors (13) store charge from the power supply and distribute the charge to the elements (15) when needed. For example, if power received by a element from a power supply line (19) attenuates, one or more decoupling capacitors (13) will distribute charge to the element (15) to ensure that the element (15) is not affected by the power variation on the power supply line (19). In essence, a decoupling capacitor acts as a local power supply for one or more specific elements in a computer system.

However, important considerations must be made as to the assignment of one or more decoupling capacitors to particular capacitance needing elements because capacitors have particular undesirable characteristics. One such characteristic pertains to two types of capacitors: thin-oxide capacitors and thick-oxide capacitors. A thin-oxide capacitor is designed using one or more transistors that have thin gate dielectric thicknesses, and although thin-oxide capacitors provide a relatively large amount of decoupling capacitance, they are prone to undesirable gate-tunneling leakage currents. Such leakage current, in turn, increases the leakage power of a circuit, resulting in increased power and heat dissipation by the circuit. Alternatively, a thick-oxide capacitor is designed using one or more transistors that have thick gate dielectric thicknesses, and although thick-oxide capacitors have less leakage currents, they provide a small amount of decoupling capacitance relative to thin-oxide capacitors. Thus, there is a need for a technique that assigns decoupling capacitors such that decoupling capacitance on an integrated circuit is increased while leakage power constraints are met.

SUMMARY OF INVENTION

According to one aspect of the present invention, a method for assigning decoupling capacitors on an integrated circuit having a plurality of drivers and a leakage power constraint comprises determining a plurality of decoupling capacitance need to available decoupling capacitance ratios for the plurality of drivers; selecting a high ratio from the plurality of ratios, where the high ratio is associated with a decoupling capacitor; determining whether a total leakage power would be greater than the leakage power constraint were the decoupling capacitor replaced with a thin-oxide decoupling capacitor; and replacing the decoupling capacitor with the thin-oxide decoupling capacitor if the total leakage power would not be greater than the leakage power constraint.

According to another aspect, a computer system comprises a processor, a memory, and instructions, residing in the memory and executable in the processor, for determining a plurality of decoupling capacitance need to available decoupling capacitance ratios for a plurality of drivers; and using the plurality of ratios to increase an amount of decoupling capacitance by replacing a decoupling capacitor with a thin-oxide decoupling capacitor without violating a leakage power constraint of the integrated circuit.

According to another aspect, a computer-readable medium having recorded therein instructions executable by processing, where the instructions are for: determining a plurality of decoupling capacitance need to available decoupling capacitance ratios for a plurality of drivers on an integrated circuit; selecting a high ratio from the plurality of ratios, where the high ratio is associated with a decoupling capacitor; determining whether a total leakage power would be greater than a leakage power constraint were the decoupling capacitor replaced with a thin-oxide decoupling capacitor; and replacing the decoupling capacitor with the thin-oxide decoupling capacitor if the total leakage power would not be greater than the leakage power constraint.

According to another aspect, a method for assigning decoupling capacitors on an integrated circuit having a plurality of drivers and a leakage power constraint comprises determining a plurality of available decoupling capacitance to decoupling capacitance need ratios for the plurality of drivers; selecting a low ratio from the plurality of ratios, where the low ratio is associated with a decoupling capacitor; determining whether a total leakage power would be greater than the leakage power constraint were the decoupling capacitor replaced with a thin-oxide decoupling capacitor; and if the total leakage power would not be greater than the leakage power constraint, replacing the decoupling capacitor with the thin-oxide decoupling capacitor.

Other aspects and advantages of the invention will be apparent from the following description and the appended claims.

DETAILED DESCRIPTION

Embodiments of the present invention relate to a method for increasing decoupling capacitance on an integrated circuit without violating a leakage power constraint. Embodiments of the present invention relate to a decoupling capacitor assignment technique that increases decoupling capacitance on an integrated circuit with respect to leakage power. Embodiments of the present invention relate to a computer system that determines an optimal decoupling capacitor assignment with respect to leakage power. Embodiments of the present invention relate to a computer-readable medium that has instructions for determining a decoupling capacitor assignment with respect to a leakage power constraint of an integrated circuit.

Figure 3:
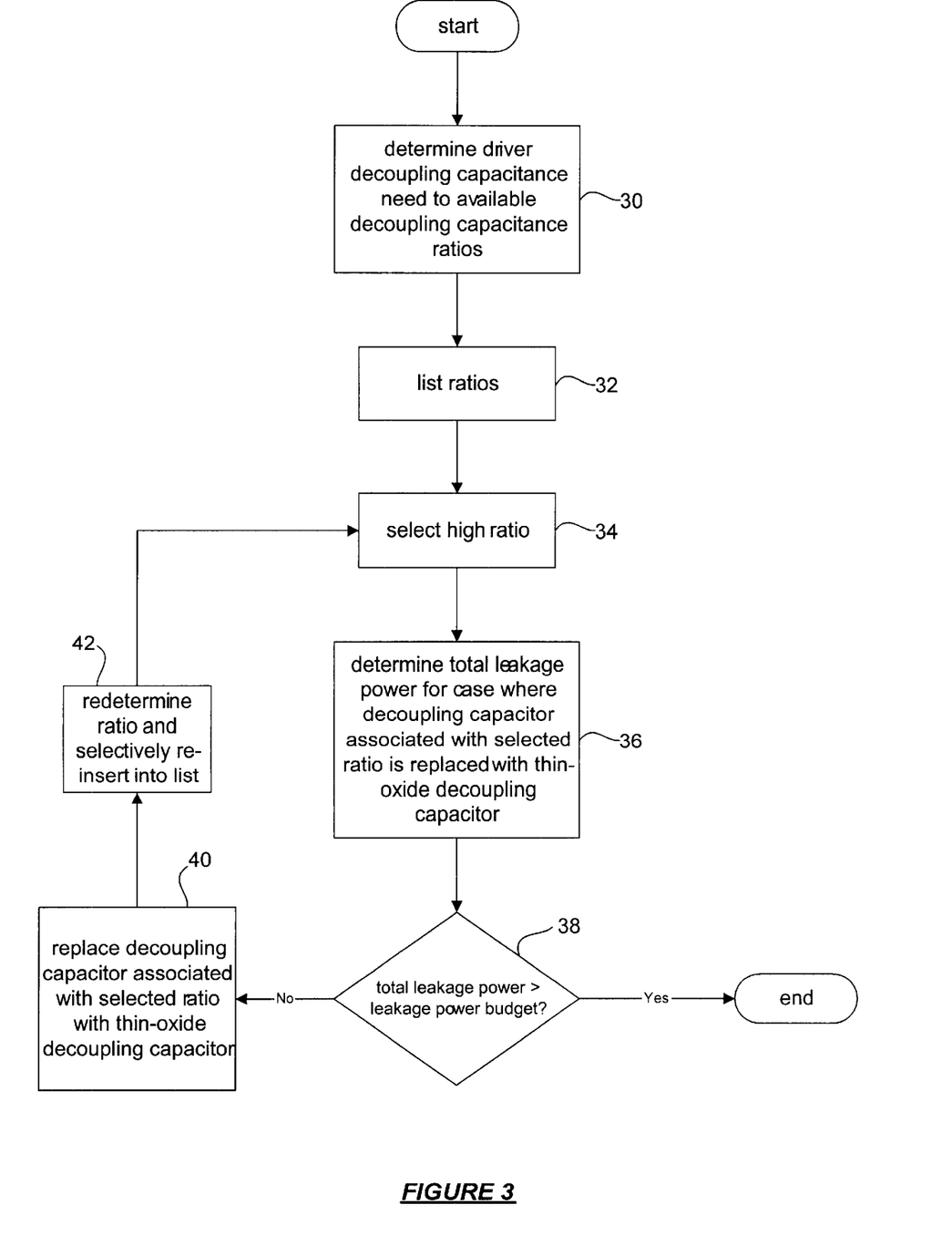
FIG. 3 shows a flow process in accordance with an embodiment of the present invention.

FIG. 3 shows an exemplary flow process in accordance with an embodiment of the present invention. Initially, driver decoupling capacitance need to available decoupling capacitance ratios are determined (step 30). In this step, the amount of decoupling capacitance provided to a particular driver from one or more decoupling capacitors is used to determine a ratio of the decoupling capacitance need of the particular driver to the amount of decoupling capacitance that is available to that particular driver. For example, if a particular driver needs 50 units of decoupling capacitance for proper operation and only receives 10 units of decoupling capacitance from the decoupling capacitors around the driver, then the driver decoupling need to available decoupling capacitance ratio is equal to 5:1.

Those skilled in the art will appreciate that, depending on desired behavior and performance, the determination of driver decoupling capacitance need to available decoupling capacitance ratios may be made for drivers residing in a particular region of an integrated circuit or for drivers across the entire integrated circuit.

Once the driver decoupling capacitance need to available decoupling capacitance ratios are determined (step 30), the ratios are listed (step 32). The ratios may be listed in various formats, including, but not limited to, software data structures, tables, and computer system data files. Further, in some embodiments, the ratios may be listed in ascending or descending order.

From the list of ratios, a high ratio from the list is chosen (step 34), or otherwise selected. Using the selected ratio, a determination is made as to whether a total leakage power would be greater than a leakage power constraint, i.e., maximum, were a decoupling capacitor associated with the selected ratio replaced with a thin-oxide decoupling capacitor (steps 36 and 38). Those skilled in the art will understand that the leakage power constraint may be for all of an integrated circuit or only for a portion of the integrated circuit on which the decoupling capacitor associated with the selected ratio resides.

If the total leakage power would not be greater than the leakage power constraint were the decoupling capacitor associated with the selected ratio replaced with a thin-oxide decoupling capacitor, then the decoupling capacitor associated with the selected ratio is replaced with a thin-oxide decoupling capacitor (step 40). Those skilled in the art will appreciate that by replacing the decoupling capacitor with a thin-oxide decoupling capacitor in the manner described above, decoupling capacitance on an integrated circuit is increased without violating a leakage power constraint of the integrated circuit.

Once the decoupling capacitor associated with the selected ratio is replaced with a thin-oxide decoupling capacitor (step 40), a new ratio of the driver decoupling capacitance need to available decoupling capacitance is determined for the driver associated with the selected ratio, and then the re-determined ratio is selectively reinserted into the list (step 40).

Those skilled in the art will appreciate that in other embodiments, once the decoupling capacitor associated with the selected ratio is replaced with a thin-oxide decoupling capacitor (step 40), the selected ratio may be removed from the list, or otherwise tagged such that it cannot be selected again.

In any event, the flow process from step 34 on repeats itself for additional ratios as long as the leakage power constraint of the integrated circuit is met.

Figure 4:
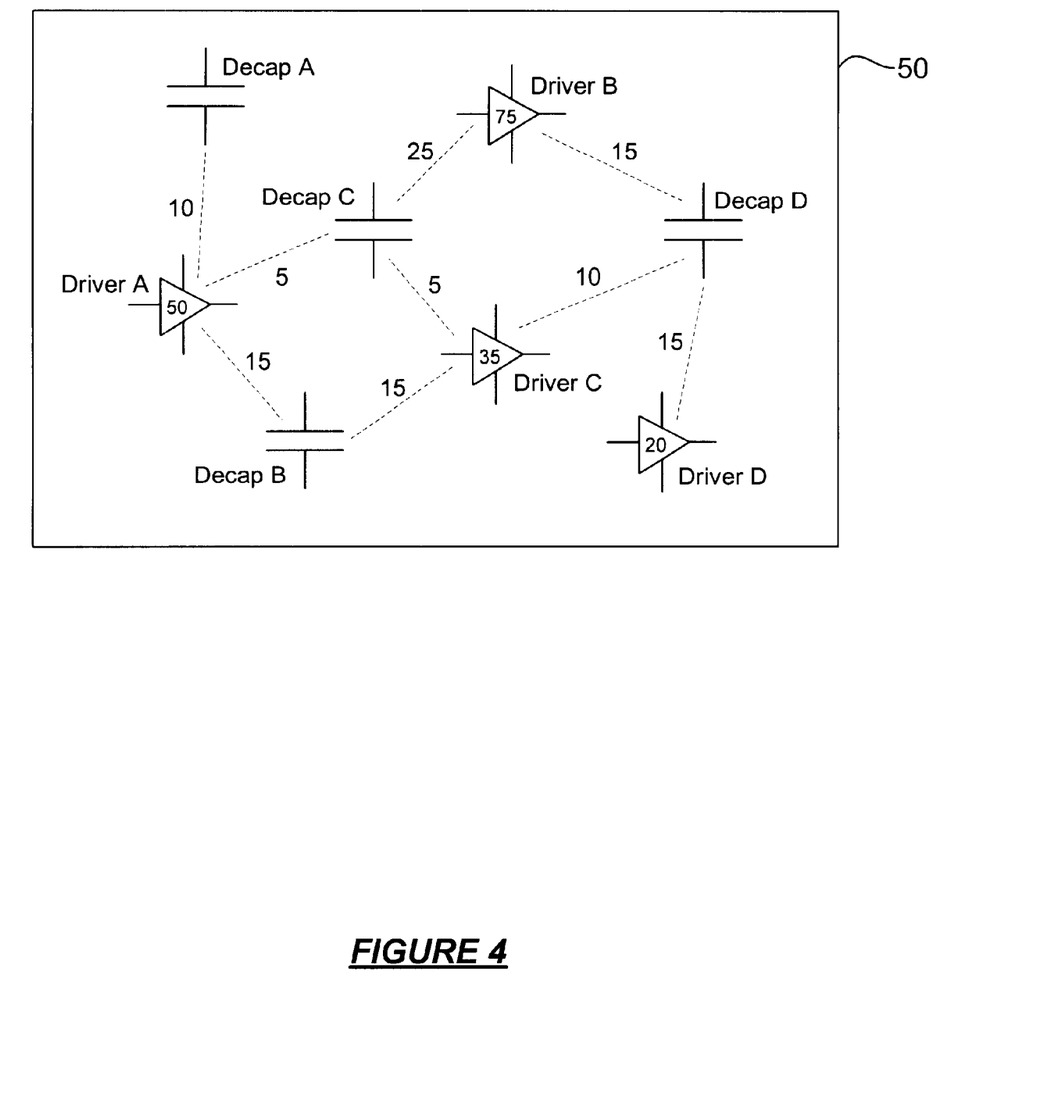
FIG. 4 shows an integrated circuit in accordance with an embodiment of the present invention.

FIG. 4 shows an exemplary integrated circuit (50) that is used to describe an embodiment of the present invention. The integrated circuit (50) has a plurality of drivers, labeled in FIG. 4 as Drivers A . . . D, and a plurality of decoupling capacitors, labeled in FIG. 4 as Decaps A . . . D. Each driver has a particular decoupling capacitance need, and for purposes of illustration, the drivers in FIG. 4 are each shown with a number representative of the decoupling capacitance need for each individual driver. For example, Driver C has a decoupling capacitance need of 35 decoupling capacitance units.

Further, dotted lines are, for illustrative purposes, shown in FIG. 4 between a particular driver and a particular decoupling capacitor if the particular decoupling capacitor provides some amount of decoupling capacitance to the particular driver. Moreover, each dotted line has a number representative of the amount of decoupling capacitance provided from the particular decoupling capacitor to the particular driver. For example, in FIG. 4, the dotted line between Decap B and Driver C indicates that Driver C has available to itself 15 units of decoupling capacitance from Decap B.

In order to determine an optimal decoupling capacitor assignment with respect to leakage power for the integrated circuit (50), driver decoupling capacitance need to available decoupling capacitance ratios are determined as shown in Table 1:

Table 1. Driver Decoupling Capacitance Need to Available Decoupling Capacitance Ratios for Drivers on Integrated Circuit (50)

| DRIVER | DECAP | RATIO |
|---|---|---|
| Driver A | Decap A | 50:10 |
| Driver A | Decap B | 50:15 |
| Driver A | Decap C | 50:5 |
| Driver B | Decap C | 75:25 |
| Driver B | Decap D | 75:15 |
| Driver C | Decap B | 35:15 |

-continued

| DRIVER | DECAP | RATIO |
| --- | --- | --- |
| Driver C | Decap C | 35:5 |
| Driver C | Decap D | 35:10 |
| Driver D | Decap D | 20:15 |

Based on the determined ratios for each driver listed in Table 1, the highest ratio is selected. In this particular embodiment, the highest ratio of driver decoupling capacitance need to available decoupling capacitance occurs between Driver A and Decap C. Once it is determined that Decap C is associated with the highest ratio, a determination is made as to whether replacing Decap C with a thin-oxide decoupling capacitor would result in a violation of a leakage power constraint of the integrated circuit (50).

For example, consider that the integrated circuit (50) has a leakage power constraint, i.e., leakage power budget, of 10 units of power. Further consider that a thin-oxide decoupling capacitor leaks 2 units of power. In this case, if an amount of leakage power already present on the integrated circuit (50) plus 2 units of leakage power due to the potential replacement of Decap C with a thin-oxide decoupling capacitor does not exceed 10 units of power, then Decap C is replaced with the thin-oxide decoupling capacitor. Thus, in effect, decoupling capacitance on the integrated circuit (50) is increased without violating the leakage power constraint of the integrated circuit (50).

Once Decap C is replaced with the thin-oxide decoupling capacitor, the ratio of driver decoupling capacitance need to available decoupling capacitance between Driver A and Decap C may be re-determined and selectively reinserted into the list, where after the highest of the ratios in the list may be chosen for subsequent decoupling capacitor replacement assessment in accordance with one of the various embodiments described in the present invention.

Still referring to FIG. 4, in another embodiment of the present invention, driver decoupling capacitance need to total available decoupling capacitance ratios may be determined as shown in Table 2:

TABLE 2

Driver Decoupling Capacitance Need to Total Available Decoupling Capacitance Ratios for Drivers on Integrated Circuit (50)

| DRIVER | DECAPS | RATIO |
| --- | --- | --- |
| Driver A | Decaps A, B, and C | 50:30 |
| Driver B | Decaps C and D | 75:40 |
| Driver C | Decaps B, C, and D | 35:30 |
| Driver D | Decap D | 20:15 |

Based on the determined ratios for each driver listed in Table 2, the highest ratio is selected. In this particular embodiment, the highest ratio of driver decoupling capacitance need to total available decoupling capacitance occurs between Driver B and Decaps C and D. Once it is determined that Driver B is associated with the highest ratio, a determination is made as to whether replacing a decoupling capacitor that provides decoupling capacitance to Driver B with a thin-oxide decoupling capacitor would result in a violation of a leakage power constraint of the integrated circuit (50).

For example, consider that the integrated circuit (50) has a leakage power constraint, i.e., leakage power budget, of 5 units of power. Further consider that a thin-oxide decoupling capacitor leaks 2 units of power. In this case, if an amount of leakage power already present on the integrated circuit (50) plus 2 units of leakage power due to the potential replacement of either Decap C or D with a thin-oxide decoupling capacitor does not exceed 10 units of power, then either Decap C or D may be replaced with the thin-oxide decoupling capacitor. Thus, in effect, decoupling capacitance on the integrated circuit (50) is increased without violating the leakage power constraint of the integrated circuit (50).

Once either Decap C or D is replaced with the thin-oxide decoupling capacitor, the ratio of driver decoupling capacitance need to total available decoupling capacitance between Driver B and Decaps C and D may be re-determined and selectively reinserted into the list, where after the highest of the remaining ratios in the list may be chosen for subsequent decoupling capacitor replacement assessment in accordance with one of the various embodiments described in the present invention.

Figure 5:
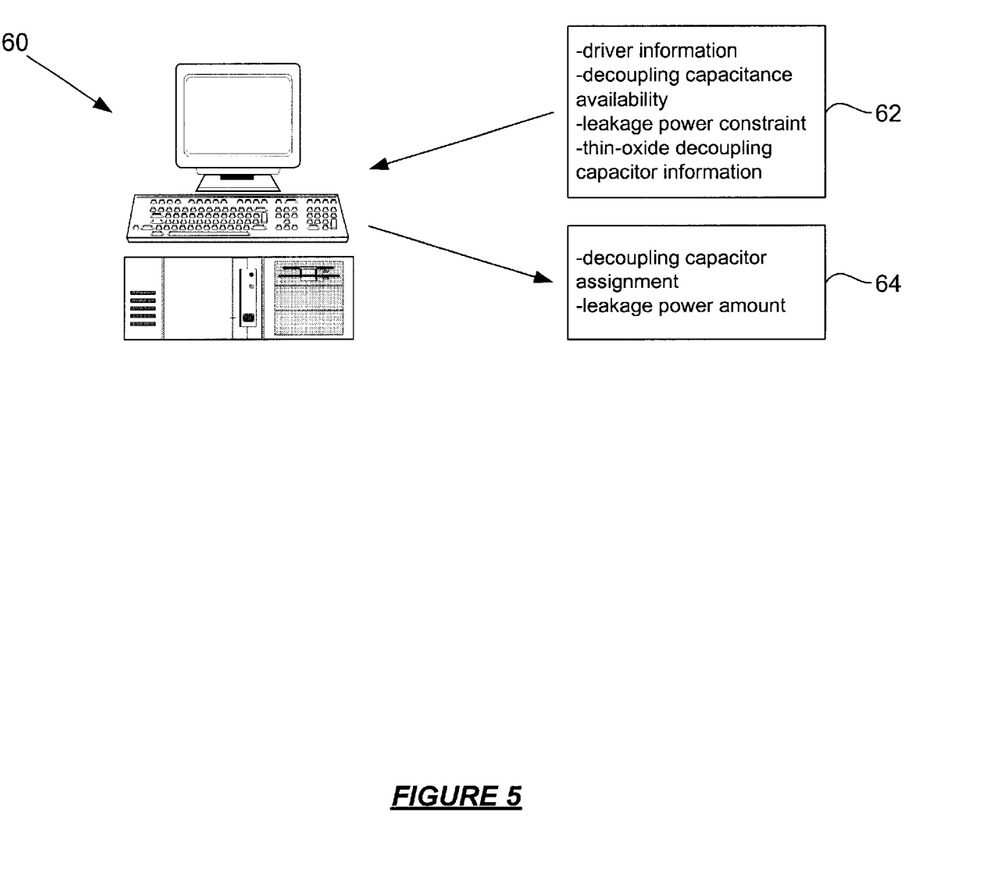
FIG. 5 shows a computer system in accordance with an embodiment of the present invention.

FIG. 5 shows an exemplary computer system (60) that determines decoupling capacitor assignments in accordance with an embodiment of the present invention. Input parameters (62) include, but are not limited to, driver information, decoupling capacitance availabilities, leakage power constraint, and thin-oxide decoupling capacitor leakage power information. One of ordinary skill in the art will understand that in alternative embodiments, the input parameters (62) mentioned above may be inputted as part of a proposed integrated circuit design.

The input parameters (62) serve as input data to the computer system (60) via some computer-readable medium, e.g., network path, floppy disk, input file, keyboard, etc. The computer system (60) then stores the input parameters (62) in memory (not shown) to subsequently determine (via microprocessor functions) a decoupling capacitor assignment using one of the various assignment techniques discussed in the present invention. Thereafter, the computer system (60) outputs the decoupling capacitor assignment (64) via some user-readable medium, e.g., monitor display, network path, etc., where the assignment indicates which decoupling capacitors should be or have been replaced with thin-oxide decoupling capacitors. The computer system (60) may additionally output the amount of leakage power resulting from the particular decoupling capacitor assignment.

Those skilled in the art will appreciate that in other embodiments, a software program capable of generating a decoupling capacitor assignment consistent with the assignment techniques presented in the present invention may be used. The software program may also be capable of determining leakage current and power values corresponding to the generated assignment of decoupling capacitors.

Those skilled in the art will understand that although the embodiments described use driver decoupling capacitance need to available decoupling capacitance ratios, embodiments of the present invention may alternatively use available decoupling capacitance to driver decoupling capacitance need ratios. In the latter case, a low ratio is selected for decoupling capacitor replacement assessment as described in the present invention. Those skilled in the art will appreciate that regardless of the particular type of ratio used, the present invention discloses methods and apparatuses to use the ratio to increase decoupling capacitance without violating a leakage power constraint of an integrated circuit.

Advantages of the present invention may include one or more of the following. In some embodiments, because a decoupling capacitance assignment technique selectively replaces decoupling capacitors with thin-oxide decoupling capacitors, decoupling capacitance on an integrated circuit may be increased, effectively leading to better system performance.

In some embodiments, the present invention provides an advantage in that a designer can find driver performance bottlenecks associated with decoupling capacitance deficiencies. In other words, in a typical prior art design process, a designer may randomly replace decoupling capacitors with thin-oxide decoupling capacitors. Although this approach increases the overall decoupling capacitance, it does not necessarily improve system performance because the decoupling capacitors that were replaced may not have been ones that were associated with decoupling capacitance deficiencies. Thus, if performance bottlenecks may be found as described in the present invention, a designer may improve system performance more assuredly, efficiently, and accurately.

In some embodiments, because a decoupling capacitance assignment technique selectively replaces decoupling capacitors with thin-oxide decoupling capacitors with respect to a leakage power constraint of an integrated circuit, decoupling capacitance on an integrated circuit may be increased without violating the leakage power constraint.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for assigning decoupling capacitors on an integrated circuit, the integrated circuit having a plurality of drivers and a leakage power constraint, the method comprising:

determining a plurality of decoupling capacitance need to available decoupling capacitance ratios for the plurality of drivers;

selecting a high ratio from the plurality of ratios, wherein the high ratio is associated with a decoupling capacitor;

determining whether a total leakage power would be greater than the leakage power constraint if the decoupling capacitor associated with said high ratio, is replaced with a thin-oxide decoupling capacitor; and if the total leakage power would not be greater than the leakage power constrain, then replacing the decoupling capacitor associated with said high ratio, with the thin-oxide decoupling capacitor.

2. The method of claim 1, wherein the plurality of ratios are sorted in ascending order.

3. The method of claim 1, wherein the plurality of ratios are sorted in descending order.

4. The method of claim 1, wherein the leakage power constraint represents an amount of allowable leakage power for a portion of the integrated circuit on which the decoupling capacitor resides.

5. The method of claim 1, further comprising:

selecting a next high ratio from the plurality of ratios, wherein the next high ratio is associated with another decoupling capacitor;

determining whether a total leakage power would be greater than the leakage power constraint if the another decoupling capacitor associated with said next high ratio, is replaced with another thin-oxide decoupling capacitor; and if the total leakage power would not be greater than the leakage power constraint, then replacing the another decoupling capacitor with the another thin-oxide decoupling capacitor.

6. A computer system, comprising:

a processor;

a memory; and instructions, residing in the memory and executable in the processor, for determining a plurality of decoupling capacitance need to available decoupling capacitance ratios for a plurality of drivers, and using the plurality of ratios to increase an amount of decoupling capacitance by replacing a decoupling capacitor with a thin-oxide decoupling capacitor without violating a leakage power constraint of the integrated circuit.

7. The computer system of claim 6, wherein the plurality of ratios are sorted in ascending order.

8. The computer system of claim 6, wherein the plurality of ratios are sorted in descending order.

9. The computer system of claim 6, wherein the leakage power constraint represents an amount of allowable leakage power for a portion of the integrated circuit on which the decoupling capacitor resides.

10. A computer-readable medium having recorded therein instructions executable by a processor, the instructions for comprising:

determining a plurality of decoupling capacitance need to available decoupling capacitance ratios for a plurality of drivers on an integrated circuit;

selecting a high ratio from the plurality of ratios, wherein the high ratio is associated with a decoupling capacitor;

determining whether a total leakage power would be greater than a leakage power constraint if the decoupling capacitor associated with said high ratio, is replaced with a thin-oxide decoupling capacitor; and if the total leakage power would not be greater than the leakage power constraint, then replacing the decoupling capacitor associated with said high ratio, with the thin-oxide decoupling capacitor.

11. The computer-readable medium of claim 10, wherein the plurality of ratios are sorted in ascending order.

12. The computer-readable medium of claim 10, wherein the plurality of ratios are sorted in descending order.

13. The computer-readable medium of claim 10, wherein the leakage power constraint represents an amount of allowable leakage power for a portion of the integrated circuit on which the decoupling capacitor resides.

14. The computer-readable medium of claim 10, further comprising instructions for:

selecting a next high ratio from the plurality of ratios, wherein the next high ratio is associated with another decoupling capacitor;

determining whether a total leakage power would be greater than the leakage power constraint if the another decoupling capacitor associated with said next high ratio, is replaced with another thin-oxide decoupling capacitor; and if the total leakage power would not be greater than the leakage power constraint, then replacing the another decoupling capacitor with the another thin-oxide decoupling capacitor.

15. A method for assigning decoupling capacitors on an integrated circuit, the integrated circuit having a plurality of drivers and a leakage power constraint, the method comprising:

determining a plurality of available decoupling capacitance to decoupling capacitance need ratios for the plurality of drivers;

selecting a low ratio from the plurality of ratios, wherein the low ratio is associated with a decoupling capacitor;

determining whether a total leakage power would be greater than the leakage power constraint if the decoupling capacitor associated with said low ratio, is replaced with a thin-oxide decoupling capacitor; and if the total leakage power would not be greater than the leakage power constraint, then replacing the decoupling capacitor associated with said low ratio, with the thin-oxide decoupling capacitor.

16. The method of claim 15, wherein the plurality of ratios are sorted in ascending order.

17. The method of claim 15, wherein the plurality of ratios are sorted in descending order.

18. The method of claim 15, wherein the leakage power constraint represents an amount of allowable leakage power for a portion of the integrated circuit on which the decoupling capacitor resides.

19. The method of claim 15, further comprising:

selecting a next low ratio from the plurality of ratios, wherein the next low ratio is associated with another decoupling capacitor;

determining whether a total leakage power would be greater than the leakage power constraint if the another decoupling capacitor associated with said next low ratio, is replaced with another thin-oxide decoupling capacitor; and if the total leakage power would not be greater than the leakage power constrain, then replacing the another decoupling capacitor with the another thin-oxide decoupling capacitor.

* * * * *